(12) United States Patent
Morris et al.

(10) Patent No.: US 7,094,307 B2
(45) Date of Patent: Aug. 22, 2006

(54) METHODS FOR COATING SURFACES WITH METAL AND PRODUCTS MADE THEREBY

(76) Inventors: Joan Morris, P.O. Box 90, 1691 Maple St., #2, Hartford, VT (US) 05047; Michele Ratte, P.O. Box 3027, 129 Spindles Path, Oak Bluffs, MA (US) 02557

( * ) Notice: Subject to any disclaimer, the term of this patent is extended or adjusted under 35 U.S.C. 154(b) by 0 days.

(21) Appl. No.: 10/666,563

(22) Filed: Sep. 19, 2003

(65) Prior Publication Data
US 2005/0196595 A1   Sep. 8, 2005

Related U.S. Application Data

(60) Provisional application No. 60/492,127, filed on Aug. 1, 2003, provisional application No. 60/438,235, filed on Jan. 6, 2003.

(51) Int. Cl.
*B32B 37/00* (2006.01)
(52) U.S. Cl. .............................. 156/275.5; 156/307.1; 156/307.3; 156/307.7
(58) Field of Classification Search .............. 156/275.5
See application file for complete search history.

(56) References Cited

U.S. PATENT DOCUMENTS

| | | | |
|---|---|---|---|
| 482,604 A * | 9/1892 | Werner | 442/73 |
| 1,210,375 A | 12/1916 | Decker | |
| 3,986,876 A | 10/1976 | Abita | |
| 4,073,777 A * | 2/1978 | O'Neill et al. | 528/295 |
| 4,242,378 A | 12/1980 | Arai | |
| 4,490,410 A * | 12/1984 | Takiyama et al. | 427/504 |
| 4,581,320 A | 4/1986 | Kreiter | |
| 5,378,298 A * | 1/1995 | Williams et al. | 156/275.5 |
| 5,422,229 A | 6/1995 | Typlin et al. | |
| 5,489,355 A | 2/1996 | Shimizu et al. | |
| 5,520,973 A | 5/1996 | Kamen et al. | |
| 5,603,259 A | 2/1997 | Gross et al. | |
| 5,891,289 A * | 4/1999 | Zemel | 156/235 |
| 5,900,096 A | 5/1999 | Zemel | |
| 5,951,801 A * | 9/1999 | Weissenfluh et al. | 156/164 |
| 6,692,611 B1 * | 2/2004 | Oxman et al. | 156/275.5 |

FOREIGN PATENT DOCUMENTS

FR   2578863   9/1986

* cited by examiner

*Primary Examiner*—Monique R. Jackson
(74) *Attorney, Agent, or Firm*—Peter A. Nieves; Sheehan Phinney Bass & Green, PA

(57) ABSTRACT

According to the process for coating metal substrates, a light-sensitive (or photo-sensitive) bonding material, such as an emulsion or a photopolymer film, is used to adhere metal directly to a substrate to provide various forms of metal coatings on the substrate. The light-sensitive bonding material is generally applied directly between the substrate and the metal layer. The light-sensitive bonding material is applied under conditions (e.g., lighting and temperature) that prevent premature curing of the light-sensitive bonding material. The light-sensitive bonding material applied between the substrate and metal is then dried and exposed to light to cure the light-sensitive bonding material in selected areas, causing the metal to adhere to the substrate in the selected areas.

16 Claims, 6 Drawing Sheets

US 7,094,307 B2

METHODS FOR COATING SURFACES WITH METAL AND PRODUCTS MADE THEREBY

CROSS-REFERENCE TO RELATED APPLICATIONS

The present application claims the benefit of U.S. Provisional Patent Application Ser. No. 60/438,235, filed on Jan. 6, 2003 and U.S. Provisional Patent Application Ser. No. 60/492,127, filed on Aug. 1, 2003 by the same inventors (entitled "METHOD FOR COATING SURFACES WITH METAL LEAF, FOIL, POWDER AND MINERAL GRAINS"), both of which are fully incorporated herein by reference.

TECHNICAL FIELD

The present invention relates to methods for coating surfaces and more particularly, to a method for coating surfaces with a metal layer or mineral grains and metal-coated products made thereby.

BACKGROUND INFORMATION

Various techniques have been used for embellishing fabrics or other materials with precious metals and other types of metal. According to a sewing or couching technique, precious metal wires and platelets are sewn to cloth and animal skins. One disadvantage to this method is that the thread often breaks and pieces of precious metal fall off the substrate. Also, the metal edges can cut thread and tear cloth.

According to a weaving and embroidery technique, precious metal leaves are glued to both sides of paper sheets using plant and animal derived glues. The sheets are then cut into narrow strips and are woven into cloth. Alternatively, the metal-coated paper strips are wound around thread filament cores and woven into cloth. One disadvantage of this technique is that the paper becomes brittle and tears easily.

According to another technique, metal leaves and powders are glued directly to substrates, such as textiles, wood, metal, glass, and plastics. Traditionally, several different kinds of glue have been used to attach metal to substrates, and the strongest glue bond was made with animal derived, or egg white, glues. However, these adhesives are not lasting, attract bugs and molds, affect the coloration of the metal, and present problems of flaking and cracking. Moreover, there has been an incompatibility problem between the smooth metals and the textural qualities of cloth, which results in "tenting" and causes the metal surface to break. Other types of adhesive used to glue metal leaves directly to substrates include starch pastes comprised of wheat, rice or arrowroot flowers. These adhesives also attract bugs and present archiving problems. Lacquers have also been used for gilding wood and metal surfaces. All of these adhesives present compatibility problems between hard metals and flexible fibers. Because most of these adhesives are water-soluble and form a weak bond, the metal-coated product is not washable.

According to another technique, substrates can be painted with metal powder. Metal dust is mixed into an adhesive base and used to paint the substrate. Using this method on cloth, however, stiffens the affected areas and results in flaking and cracking.

Thus, the existing techniques discussed above all have similar drawbacks. These techniques typically require complicated multi-step processes. The metal-coated products produced using these techniques are also not durable and not washable. Furthermore, these techniques often cannot produce metal-coated products with the high resolution patterning and other aesthetic properties desired in the fashion, interior decorating, electronics, jewelry, and technology industries.

Accordingly, there is a need for a relatively simple method of coating a substrate with a metal layer, which is capable of producing a metal-coated product having the desired durability and aesthetic properties.

SUMMARY

In accordance with one aspect of the present invention, a method is provided for coating a substrate with a metal layer. A light-sensitive bonding material is applied between the substrate and the metal layer under lighting conditions to prevent premature curing of the light-sensitive bonding material, thereby forming a metal-coated substrate. The light-sensitive bonding material is dried at a temperature compatible with the bonding material and under lighting conditions to prevent premature curing of the bonding material. The metal-coated substrate is then exposed to a light source having an intensity and for a period of time sufficient to cure at least portions of the light-sensitive bonding material.

In accordance with another aspect of the present invention, a metal-coated article comprises at least a first substrate and a metal layer adhered to the substrate using a cured light-sensitive bonding material.

In accordance with another aspect of the present invention, a method is provided for making a metal transfer sheet. A thin layer of light-sensitive bonding material is applied to a metal layer mounted on a release sheet under lighting conditions to prevent premature curing of the bonding material. The bonding material is dried under lighting conditions to prevent premature curing of the bonding material and at a temperature compatible with the bonding material to form the metal transfer sheet. The metal transfer sheet is packaged in a light-tight container.

In accordance with a further aspect of the present invention, a metal-coated transfer sheet comprises a metal layer and a coating of dried, non-cured light-sensitive emulsion on the metal layer.

In accordance with yet another aspect of the present invention, a method is provided for coating a substrate with metal using a metal coating paste. A metal material is combined with a light-sensitive emulsion to form the metal coating paste. The metal coating paste is preserved under conditions to prevent premature curing of the emulsion contained in the metal coating paste. The metal coating paste is applied onto a substrate under lighting conditions to prevent premature curing of the emulsion contained in the metal coating paste. The metal-coated substrate is then exposed to a light source having an intensity and for a period of time sufficient to cure the light-sensitive emulsion contained in the metal coating paste.

In accordance with a further aspect of the present invention, a method is provided for preparing a metal coating paste. The metal material is combined with a light-sensitive emulsion to form a metal coating paste. The metal coating paste is stored in a light-tight container to prevent premature curing of the emulsion.

In accordance with yet another aspect of the present invention, a method is provided for setting objects in a metal-coated substrate. An object is placed on a backing substrate and a metal-coated substrate is placed over the object. The metal-coated substrate includes a metal layer adhered to a substrate layer using a cured light-sensitive bonding material. The metal-coated substrate is secured to the backing substrate around a perimeter of the metal-coated substrate, thereby trapping the object between the substrates. The metal-coated substrate is then conformed to the shape of the object. A portion of the metal-coated substrate is cut around a face of the object such that the metal-coated substrate forms a sloping flange around the object to secure the object to the backing substrate.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

According to the present invention, a light-sensitive (or photo-sensitive) bonding material is used to adhere metal directly to a substrate to provide various forms of metal coating on the substrate. The light-sensitive bonding material is generally applied directly between the substrate and the metal layer. The light-sensitive bonding material is applied under conditions (e.g., lighting and temperature) that prevent premature curing of the light-sensitive bonding material. The light-sensitive bonding material applied between the substrate and metal is then exposed to light to cure the light-sensitive bonding material in selected areas, causing the metal to adhere to the substrate in the selected areas.

In one preferred embodiment, the light-sensitive bonding material is a sensitized, light-sensitive, photographic liquid emulsion (also called "direct emulsion") capable of creating a bond between the substrate and metal layer after exposure to electromagnetic radiation. Examples of suitable light-sensitive emulsions include, but are not limited to, Autotype Plus 6000 CL, Ulano TLX/CL, Speedball Diazo Photo Emulsion, Chromaline CP5/WR, and other similar non-commercial photo-sensitive liquid emulsions.

In another embodiment, the light-sensitive bonding material is a photopolymer film, such as a diazo-sensitized capillary film. Examples of suitable photopolymer films include, but are not limited to, diazo-sensitized capillary films available from Chromaline under the name Pro/Cap® and films available from Ulano Corporation under the names CDF Matrix and CDF LX.

Examples of the substrate includes, but are not limited to, fabric, leather, wood, paper, glass, fiberglass, plastic and sheet metal. Examples of the metal include, but are not limited to, gold, silver, platinum, copper and aluminum and may be in the form of metal leaf, foil, powder and mineral grains.

These methods preferably result in a durable, washable, flexible, shape-conforming, non-flaking and non-dissolving metal coating. The metal-coated materials created using this process remain durable after repeated laundering or washing. The metal coating can be provided as a continuous surface coverage or as a pattern. Metal-coated textile and leather materials made according to these methods can be used for preparing high value garments, interior design fabrics (e.g., curtains, wall coverings, upholstery fabrics, screens, and the like), fashion fabrics, fashion shoes, handbags, belts, and the like. The present invention has many possible applications suited to the fields of art, textiles, fashion, interior design, theater and electronics.

Figure 1:
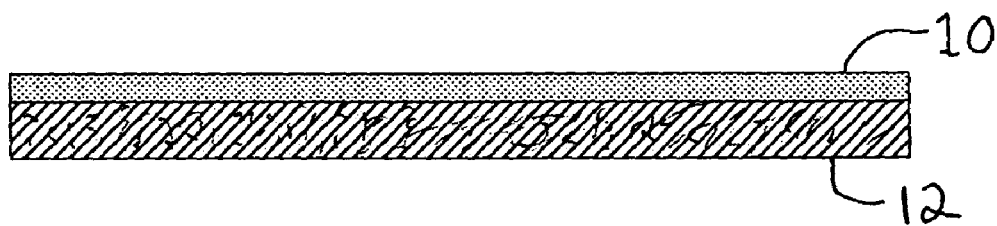
FIGS. 1–3 are cross-sectional views of a substrate being coated with a metal layer, according to one embodiment of the present invention.
Figure 2:
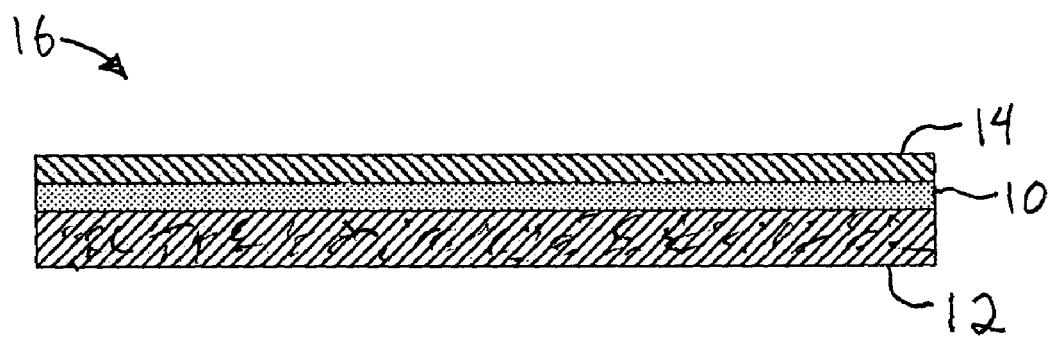
Figure 3:
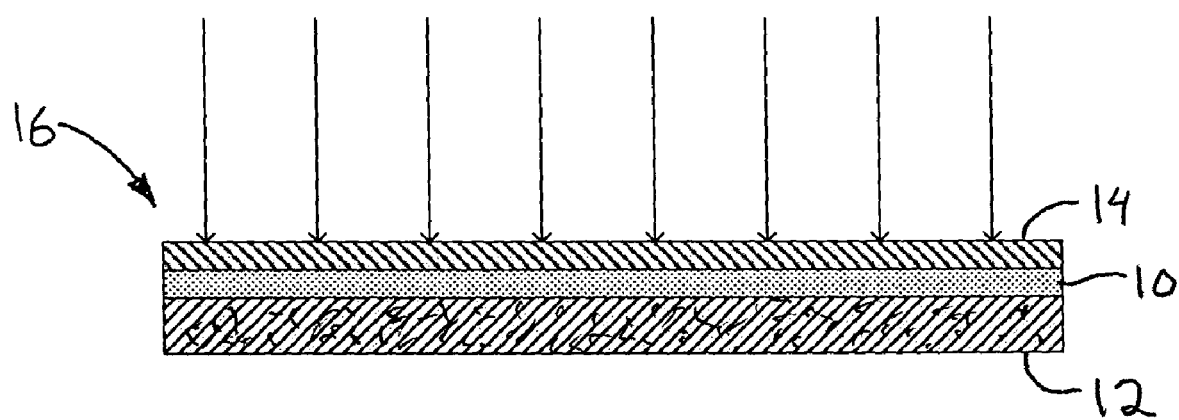

Referring to FIGS. 1–3, embodiments of the invention are described in greater detail. In a darkened room using a safelight to illuminate the work space, a layer 10 of light-sensitive bonding material is applied to a substrate 12 (FIG. 1). In one embodiment, the layer 10 of light-sensitive bonding material is a layer of emulsion applied as thin as possible while obtaining total and continuous coverage, for example, by using a squeegee, scoop coater, brush, roller, or other suitable applicator. While the emulsion layer 10 is wet, a metal layer 14 (e.g., metal leaf, foil, powder or mineral grains) is laid down over the emulsion layer 10 (FIG. 2). The metal layer 14 is applied with adequately even overall pressure in order to achieve substantially uniform adherence to the surface of the emulsion layer 10 on the substrate 12. The emulsion layer 10 is preferably Prevented from drying out prematurely before the application of the metal layer 14. Also, the emulsion layer 10 should preferably not be exposed to heat which can dry the emulsion and cure it prematurely.

In another embodiment, the layer 10 of light-sensitive bonding material is a photopolymer film, which is also applied in a safelight environment. In this embodiment, the substrate 12 is first wetted (preferably using water) and the film is rolled onto the wet substrate 12. The film is preferably uniformly adhered to the substrate 12. The film typically has a backing material which is removed after the film is adhered to the wet substrate 12. The film adhered to the substrate 12 is then wetted (preferably using water) evenly, forming a tacky surface on the film (preferably without any standing water). The metal layer 14 is then applied over the wet film in a manner similar to that described above.

The layer 10 of light-sensitive bonding material (e.g., either the emulsion or the wet photopolymer film) is then allowed to air dry thoroughly at a temperature compatible with the emulsion used, preferably in a dehumidified area and in complete darkness or under safelight conditions. The coated product 16 is then exposed to a light source, such as artificial light or sunlight, with sufficient intensity to penetrate either the metal layer 14 or the substrate 12 (FIG. 3). If the substrate 12 is opaque to light (e.g., wood, leather, and the like), then the light-sensitive bonding material must be exposed through the metal layer 14. If the substrate 12 is transparent or translucent, allowing sufficient light to pass through it, then the light-sensitive bonding material is preferably exposed through the substrate 12.

The exposure is preferably performed for a period of time sufficient to cure the light-sensitive bonding material. This period of time generally depends upon the light-sensitive bonding material and the light source used and in some cases can range from a few seconds to a few hours. To determine sufficient exposure, the permanence of adhesion can be checked using a suitable wash-fastness test.

Figure 4:
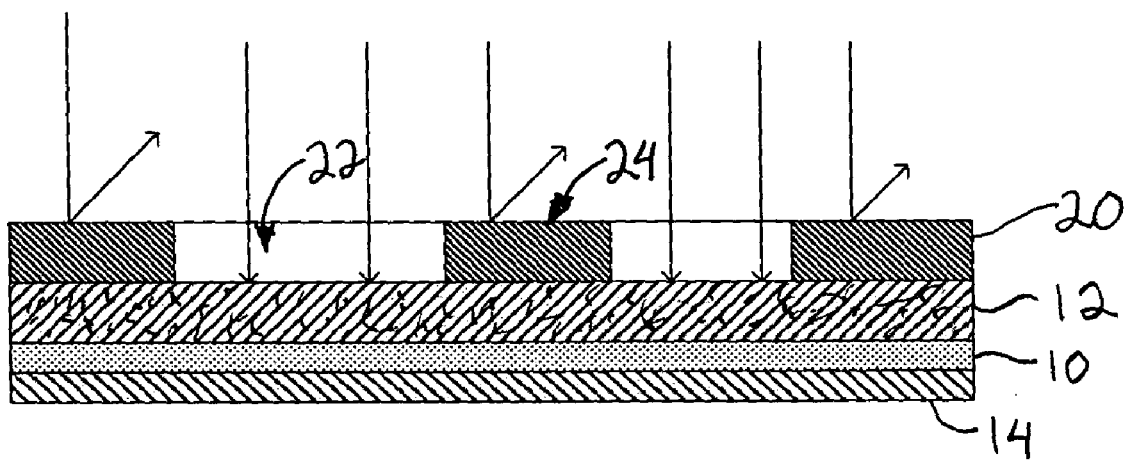
FIGS. 4 and 5 are cross-sectional views of a substrate being coated with a metal layer in a pattern, according to another embodiment of the present invention.
Figure 5:
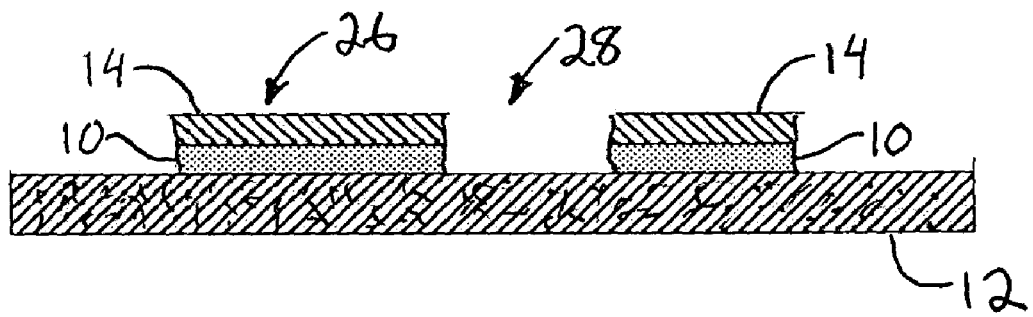

Referring to FIGS. 4 and 5, another embodiment of the invention is described in greater detail. In this embodiment, the layer 10 of light-sensitive bonding material and the metal layer 14 are applied as discussed above. A film or mask 20 having transparent regions 22 and opaque regions 24 forming a desired pattern is preferably placed over the substrate 12 (FIG. 4), but can also be placed over the metal layer 14. The coated product 16 is then exposed to a light source such that the light-sensitive bonding material is cured in exposed regions 26 beneath the transparent regions 22 and the light-sensitive bonding material remains uncured in unexposed regions 28 beneath the opaque regions 24. The portions of the layer 10 of light-sensitive bonding material and the metal layer 14 in the unexposed regions 28 are removed, for example, by spraying with a strong shower of water at room temperature under safelight conditions. The metal and light-sensitive bonding material (e.g., the emulsion) that is removed can be used to form a metal-coating paste, as described in greater detail below. The adhered metal layer 14 in the exposed regions 26 (FIG. 5) is left behind and forms a pattern corresponding to the pattern provided by the mask 20.

This method of using the film or mask 20 to form the pattern is preferably used with substrate materials that are permeable to water to allow the unexposed regions 28 to be "sprayed out" through the substrate 12. Although other substrate materials can be used, using a substrate 12 that is not permeable to water makes it more difficult to remove the unexposed regions 28 without damaging the metal layer 14 on the exposed regions 26.

Figure 6:
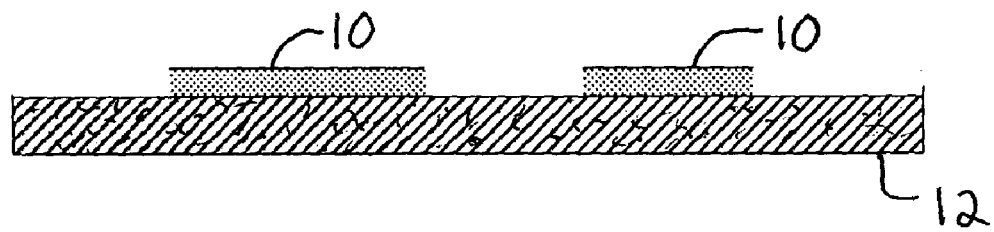
FIGS. 6–8 are cross-sectional views of a substrate being coated with a metal layer by printing a pattern, according to another embodiment of the present invention.
Figure 7:
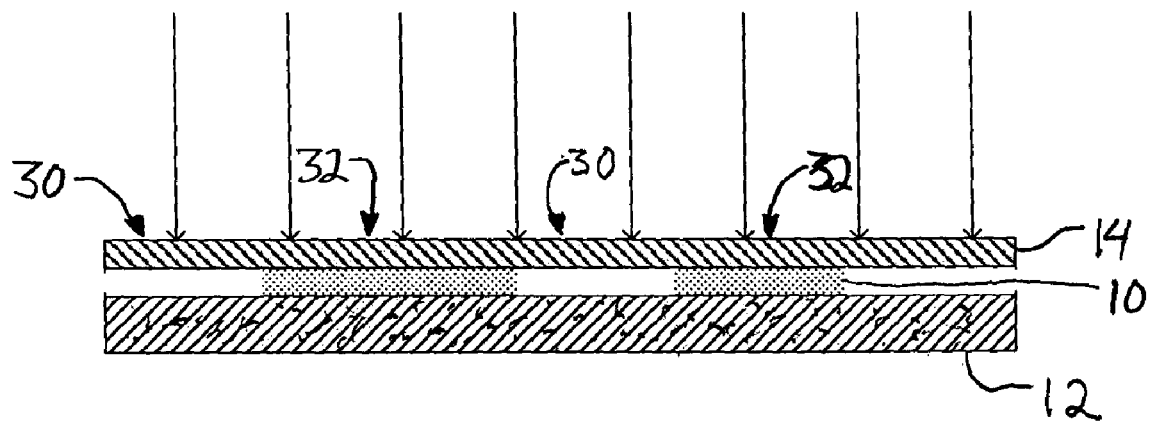
Figure 8:
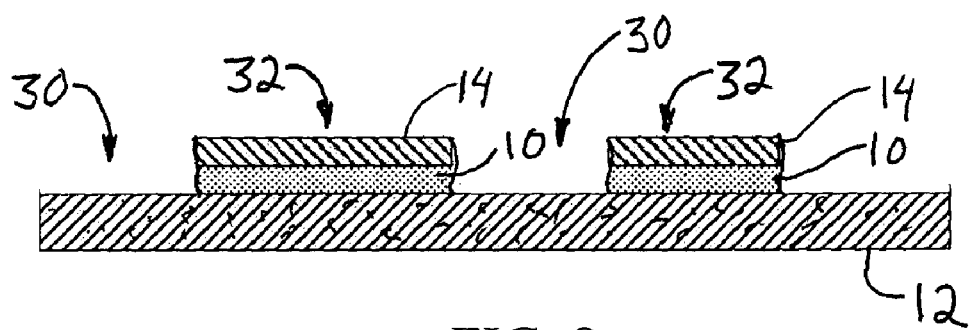

Referring to FIGS. 6–8, a further embodiment of the invention is described. According to this method, a layer 10 of light-sensitive emulsion in liquid form is selectively applied to the substrate 12 leaving some areas of the substrate 12 free of emulsion. For example, the emulsion layer 10 can be printed in a desired pattern on the substrate 12 using a silk-screen or other suitable printing technique (FIG. 6). Alternatively, the emulsion layer 10 can be selectively applied by painting, rolling or spraying onto the substrate 12.

The metal layer 14 is then applied, the emulsion layer 10 is dried, and the coated product 16 is exposed to light (either through the metal layer 14 or through the substrate 12), as described above (FIG. 7). The metal layer 14 is unadhered on regions 30 that are free of emulsion. Unadhered regions 30 of the metal layer 14 are removed, for example, by washing or brushing, while adhered regions 32 of the metal layer 14 remain (FIG. 8). This is a preferred method for forming a metal pattern on a substrate that is not permeable to water because the metal layer 14 on the unadhered regions 30 is generally easier to remove.

Figure 9:
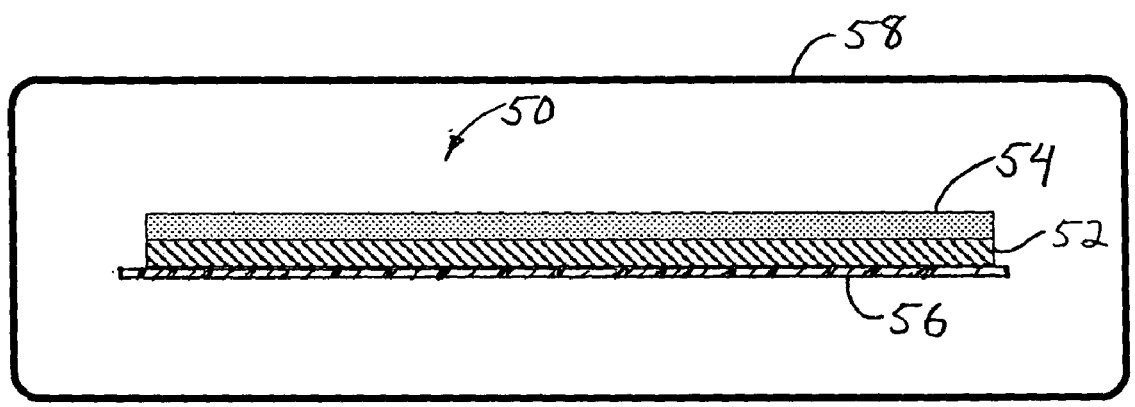
FIG. 9 is a cross-sectional view of a packaged metal transfer sheet, according to a further embodiment of the present invention.
Figure 10:
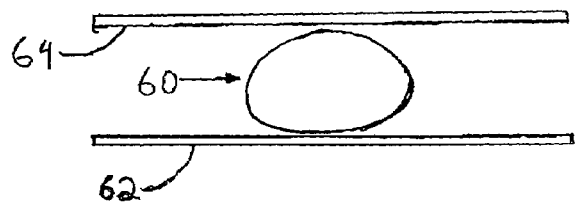
FIGS. 10–16 are schematic views illustrating a process for using a metal-coated substrate to form a bezel, according to yet another embodiment of the present invention.
Figure 11:
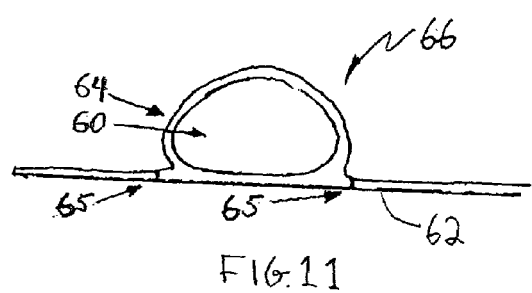
Figure 12:
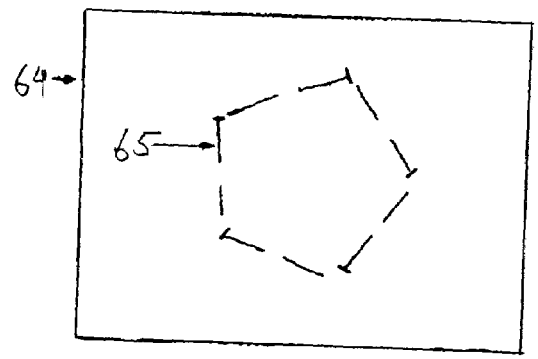

Referring to FIG. 9, a method of making a "readymade" storable, metal-coated transfer sheet 50 is described in greater detail. The transfer sheet 50 includes a metal layer 52, a thin layer 54 of dried photo-sensitized emulsion, and a release sheet 56. The metal-coated transfer sheet 50 can be stored and used for transferring the metal layer 52 onto a substrate at a later time. The transfer sheet 50 is preferably stored in a "light-tight" container 58 until use.

According to one method of making the transfer sheets 50, a thin layer 54 of photosensitive emulsion is applied in liquid form to the metal layer 52 mounted on the release sheet 56 (e.g., a paper release sheet) in a darkened room under safelight conditions. The emulsion can be applied using any suitable method such as a high volume, low pressure (HVLP) sprayer. The emulsion is allowed to air dry thoroughly at a temperature compatible with the emulsion used, preferably in a dehumidified area and in complete darkness. The transfer sheets 50 are then packaged in the light-tight container 58 and stored in a dark, dry place.

In use, the transfer sheets 50 are placed with the emulsion layer 54 down on a water-dampened surface of a substrate. Pressure is applied, for example, using a calendaring device. The emulsion is allowed to dry in a darkened room. The release sheet 56 is removed and the transfer sheet 50 is exposed to a suitable light source until the emulsion is cured.

Figure 13:
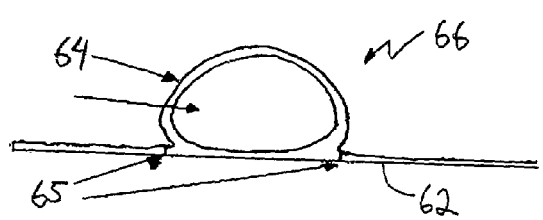
Figure 14:
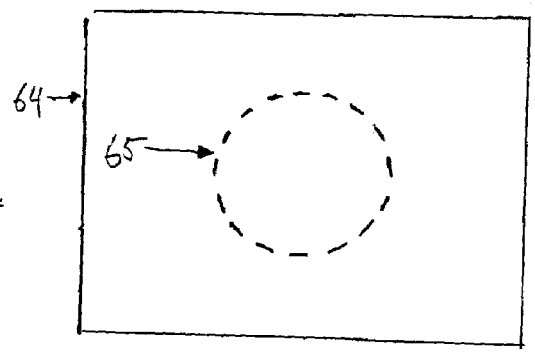

Referring to FIGS. 10–16, a method of forming a bezel for mounting a stone or other object using a metal-coated substrate is described in detail. An object 60 (e.g., a stone) is set on a backing substrate 62 and a metal-coated substrate 64 is placed over the object 60. In this embodiment, the metal-coated substrate 64 includes a shape-conforming substrate. The shape-conforming substrate is preferably a silk or other fabric with an over-spun warp or weft. The backing substrate 62 can be any type of sturdy, tightly woven or non-woven, textile, such as silk, cotton, or polyester. The object 60 is secured in place between the substrates 62, 64. In the exemplary embodiment, the object 60 is secured by pinning around the perimeter 65 of the object 60 and through the substrates 62, 64 (FIGS. 11 and 12) and by sewing a line around the perimeter 65 of the object 60 and through the substrates 62, 64 (FIGS. 13 and 14).

Figure 15:
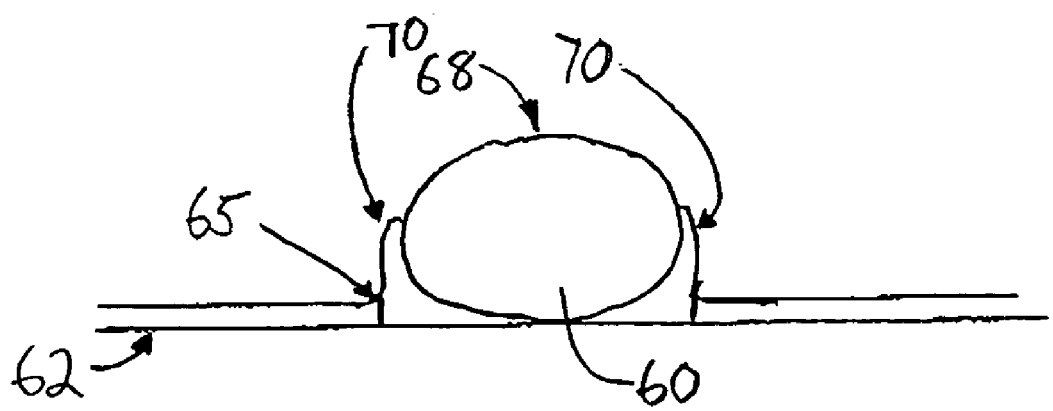
Figure 16:
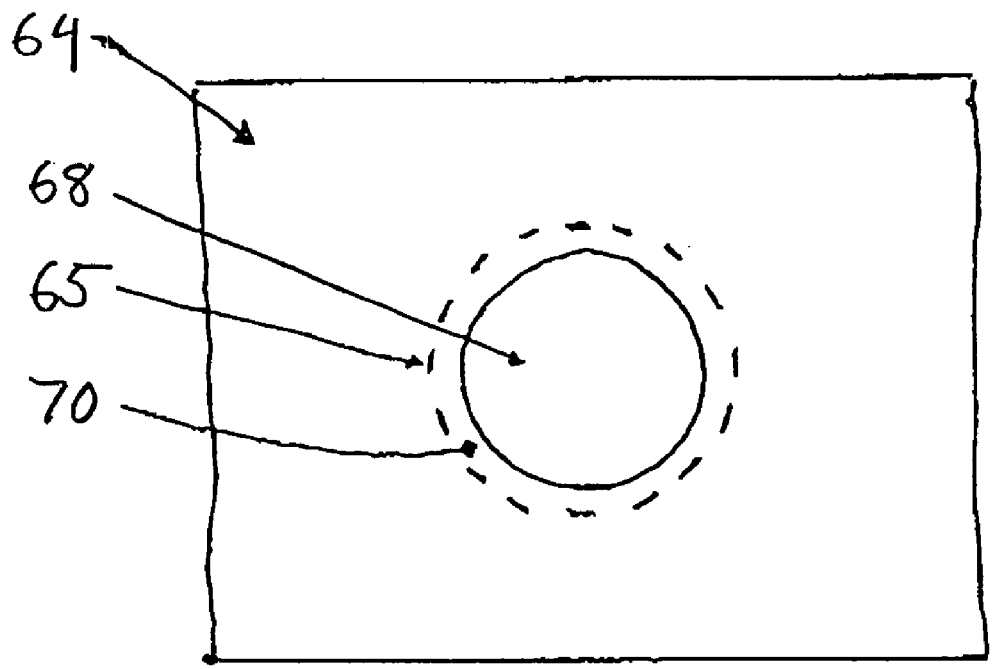

The assembly 66 is then submerged in a hot water bath (optimally about 120 to 140° F.) for a period of time (e.g., typically about 10 minutes) sufficient to crepe the shape conforming metal-coated substrate 64. Alternatively, the assembly 66 can be subjected to steam. The assembly 66 is then removed from the hot water bath or steam, blocked into shape (if needed), and dried flat. The shape-conforming metal-coated substrate 64 shrinks and conforms to the object 60. Once completely dried, a sharp tool (e.g., a blade such as a knife or scissors) is used to cut a hole through the metal-coated substrate 64 to cut away the substrate 64 from the face 68 of the object 60 (FIGS. 15 and 16). A width of the metal-coated substrate 64 forms a sloping flange 70 (commonly referred to as a "bezel") around the base of the object 60 in a width sufficient to secure the object 60 in place.

According to a further method, a metal coating paste can be formed by combining a metal material with a light-sensitive emulsion. For example, the metal layer and the emulsion layer removed from the unexposed regions in the method described above can be used to form a metal coating paste. The metal coating paste can be stored in a light-tight container for use at a later time. According to one method of use, the metal coating paste is applied to a substrate, for example, by painting onto the substrate under a safelight. The metal coating paste is then allowed to dry and is exposed to light to cure the emulsion contained in the metal coating paste.

According to another method of use, the metal coating paste can also be poured into a release mold and formed into a 3-dimensional shape. Once the metal coating paste is dried in the mold, it is exposed to light sufficient to cure the emulsion contained in the metal coating paste.

Embodiments of the present invention are now further described by way of the following specific examples, which are not meant to be limitations on the present invention.

EXAMPLE 1

A silk fabric was stretched on a frame. In a room with yellow safelight, the entire area of silk was coated with a thin, uniform layer of Autosol 6000 CL sensitized silk-screen emulsion. Both sides of the silk were coated using a scoop coater. The frame was then placed face down on a horizontal surface with the edges carefully elevated so that the wet emulsion was not touching the surface on which the screen was resting.

A layer of patent gold leaf was applied immediately to the wet emulsion, and the entire silk area was covered with gold leaf. The gold leaf was then covered with wax coated paper and a gentle but firm pressure was applied over the entire gold leaf covered surface. The wax paper was removed, and the coated silk was allowed to air dry in the dark. The release paper was then removed from the gold leaf, which was adhered firmly to the emulsion coated silk surface.

The frame was then placed metal leaf side down on a flat, black surface, and a film positive with opaque patterns was placed inside the frame and onto the silk. The film positive was then covered with a piece of plate glass and exposed to a 300-watt light bulb (General Electric Standard Incandescent Lamp 130 Volts/longlife), at a distance of 24 inches from the surface of the silk for 2 hours. In a darkened room with a yellow safelight to illuminate the work area, the stretched fabric was then sprayed with a sharp blast of cool water on the non-metal side of the screen. The gold-coated pattern emerged as the water forced the unexposed emulsion, and the gold leaf attached to it, to rewet and fall from the surface of the silk. The stretched fabric was then dried in direct light (i.e., outdoors in the sun) and was removed from the frame and allowed to air dry in the light area for an additional two hours.

The gold-coated fabric was then washed in a standard washing machine on delicate cycle and air dried. The patterned gold coating was preserved without any damage. When this laundering procedure was repeated, no damage occurred to the gold-coated surface.

EXAMPLE 2

A length of fabric yardage was stretched onto a padded printing table and secured in place. A yellow safelight was used as the source of illumination for the workspace. A pattern was silk-screened onto the fabric using Autosol 6000 CL sensitized silk-screen photo emulsion as the printing medium. While the emulsion was wet, a layer of gold leaf was applied to the surface of the fabric to cover the entire printed area with gold leaf. The printed, gold-covered surface was then covered with wax paper and even pressure was applied to the entire area, thereby aiding the bond between the emulsion and the metal. The waxed paper was removed and the printed fabric was dried in the dark.

The printed fabric was then exposed to light using a 300-watt light bulb (General Electric Standard Incandescent Lamp 130 volts/longlife) at a distance of 24 inches and for a period of time of 2 hours. The excess metal leaf was then removed with a soft bristle brush. The printed metal leafed fabric was then further cured in a light room for two hours. It was then hand washed in warm, soapy water for five minutes, rinsed in cool water and air dried. The gold-coated, printed pattern was preserved without any damage. The laundering procedure was repeated several times with no harmful effects to the gold-coated surface.

EXAMPLE 3

Using a yellow safelight as a source of illumination for the workspace, a smoothly sanded and clean, dry wooden board was painted with a thin layer of Ulano TLX/CL sensitized silk-screen emulsion. A layer of silver leaf was applied to the wet emulsion-coated surface. The emulsion was dried in the dark and then was exposed, metal side up, to direct sunlight for several hours. The silver-coated wood was then soaked in a bucket of warm, soapy water for 15 minutes, rinsed in warm water and dried. The silver surface was preserved without any damage. A patterning method similar to that used in Example 2 was also used with this application of silver leaf onto wood.

EXAMPLE 4

In a room with a yellow safelight for illumination, a piece of undyed chamois was stretched and then pinned to a padded printing table. Using a silk-screen with an unstenciled mesh (i.e., no pattern, just open mesh), the leather was coated with an even and thin layer of Chromaline CP5/WR sensitized photo-emulsion. A layer of gold leaf was applied to the wet, emulsion-coated surface. Waxed paper was placed over the leaf, and the leaves were gently but firmly pressed to enhance the bond. The waxed paper was then removed, and the emulsion and gold-covered leather was dried. After drying, the gold-covered leather was placed in strong sunlight, metal side up, for eight hours to cure. The gold-covered leather was washed in warm, soapy water and soaked for 15 minutes before rinsing in warm water. No damage to the gold-coated surface resulted. Patterning methods similar to those used in Example 2 were also used with this application of gold leaf onto leather.

EXAMPLE 5

The process described in Example 1 was performed using a silk substrate woven with over-spun warp and weft that was prepared for printing but not scoured. Most of the steps of Example 1 were followed, but the fabric was not laundered after removal from the stretching frame. A cabochon with a diameter of approximately one inch was selected and placed face up on a washable backing substrate of silk. A piece of gold-coated silk, prepared as discussed above, was placed over the cabochon and pinned to the backing substrate in such a way as to articulate the perimeter of the stone. Using a needle and a strong thin thread, a ring of hand stitching was sewn around the perimeter of the stone through both layers of fabric, tightly securing the cabochon within the two layers. This assembly was then plunged into hot water (about 120° F.) and soaked for ten minutes. The wet assembly was then removed from the water, blocked into shape, and air dried flat. Once completely dry, a sharp blade was used to pierce a small hole through the gold fabric at the center of the cabochon. A shape describing the face of the stone was cut, leaving a one-quarter inch sloping flange around the edge of the stone to hold the stone in place.

EXAMPLE 6

Using a yellow safelight source for illumination of the workspace, a thin layer of Autosol 6000 CL sensitized silk-screen emulsion was deposited onto a smooth surfaced four-inch square of glass and a four-inch square of Plexiglas using a HVLP sprayer. A layer of metal leaf was applied to the wet emulsion-coated surfaces. The emulsion was dried in the dark and then exposed, metal side down, to direct sunlight for several hours. The two samples were then soaked in a bucket of warm, soapy water for 15 minutes, rinsed in warm water and dried. The gold-coated surfaces were preserved without damage. A patterning method similar to that used in Example 2 was also used with this application.

EXAMPLE 7

Using a piece of polyester mesh and a standard sink drain strainer, pressed into the drain of the washout area, the metal leavings from the washout process of Example 1 were recovered. The recovered material was comprised of uncured emulsion, water and metal and had the consistency of paste. The paste was stored in a light-tight container and was used months later. At the time of use, the paste was painted onto different substrates of nylon, cotton and acetate in a yellow-lit room. The paste was allowed to dry and then was exposed to daylight for two hours.

Accordingly, the exemplary metal coating processes of the present invention are relatively simple, allowing affordable metal-coated products to be made, even when using precious metals. The exemplary metal coating processes are also relatively safe, clean and fast and thus beneficial to producers and to the environment. These processes can be used to make durable metal-coated products that are washable, flexible, shape-conforming, and non-flaking. The metal coating can be applied with a continuous surface printing, painting, rolling or spraying process or with discrete, highly articulated patterns. The metal also retains its original color and excellent brightness to provide a highly reflective metal coating.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

The invention claimed is:

1. A method of coating a substrate with a metal layer, comprising the steps of:
   applying a wet light-sensitive bonding material between said substrate and said metal layer under lighting conditions to prevent premature curing of said bonding material and allowing said bonding material to remain wet, thereby forming a metal-coated substrate;
   drying said wet light-sensitive bonding material at a temperature compatible with said bonding material and under lighting conditions to prevent premature curing of said bonding material; and
   exposing said metal-coated substrate to a light source having an intensity and for a period of time sufficient to cure at least portions of said light-sensitive bonding material.

2. The method of claim 1 wherein the step of applying said light-sensitive bonding material between said substrate and said metal layer includes wetting a surface of said substrate, applying a light-sensitive photopolymer film to said surface of said substrate, wetting said photopolymer film, and applying said metal layer to said wet photopolymer film.

3. The method of claim 1 wherein said light-sensitive bonding material includes a light-sensitive emulsion in liquid form.

4. The method of claim 1 wherein the step of applying said light-sensitive bonding material between said substrate and said metal layer includes applying a substantially continuous layer of light-sensitive emulsion in liquid form to said substrate and applying said metal layer to said emulsion in liquid form.

5. The method of claim 1 wherein the step of applying said light-sensitive bonding material between said substrate and said metal layer includes selectively applying a substantially continuous layer of light-sensitive emulsion in liquid form to said substrate in a predetermined pattern and applying said metal layer to said emulsion in liquid form.

6. The method of claim 5 further comprising the step of removing unadhered portions of said metal layer.

7. The method of claim 1 wherein the step of drying said light-sensitive bonding material includes allowing said light-sensitive bonding material to air dry.

8. The method of claim 1 wherein said light source is directed at said metal layer.

9. The method of claim 1 wherein said light source is directed at said substrate.

10. The method of claim 1 further comprising the steps of:
    placing a mask over said metal-coated substrate before exposing said metal-coated substrate to said light source, wherein said mask has transparent and opaque regions in a pattern; and
    removing said bonding material and said metal layer from unexposed regions beneath said opaque regions of said mask.

11. The method of claim 1 wherein said metal layer is metal leaf.

12. The method of claim 1 wherein said metal layer includes a precious metal.

13. A method of coating a substrate with a metal, wherein said substrate comprises individual fibers, the method comprising the steps of:
    applying a liquid light-sensitive bonding material to said substrate under lighting conditions to prevent premature curing of said liquid light-sensitive bonding material, resulting in a portion of said wet light-sensitive bonding material being absorbed into said substrate, and resulting in said substrate being wet;
    applying said metal to said wet substrate under lighting conditions to prevent premature curing of said bonding material and allowing said substrate to remain wet, thereby forming a wet metal-coated substrate;
    drying said wet substrate at a temperature compatible with said bonding material and under lighting conditions to prevent premature curing of said bonding material, thereby resulting in portions of said metal adhering to a portion of said individual fibers; and
    exposing said dry substrate to a light source having an intensity and for a period of time sufficient to cure at least portions of said light-sensitive bonding material.

14. The method of claim 13, further comprising the step of washing said coated substrate to remove excess bonding material and excess metal.

15. The method of claim 13, wherein said metal layer is metal powder.

16. The method of claim 13, wherein said metal layer is metal leaf.

* * * * *